US011170698B2

(12) United States Patent
Nadershahi

(10) Patent No.: US 11,170,698 B2
(45) Date of Patent: Nov. 9, 2021

(54) ACTIVE DISCHARGE CIRCUITRY FOR DISPLAY MATRIX

(71) Applicant: PLANAR SYSTEMS, INC., Beaverton, OR (US)

(72) Inventor: Shahnad Nadershahi, Beaverton, OR (US)

(73) Assignee: Planar Systems, Inc., Beaverton, OR (US)

( * ) Notice: Subject to any disclaimer, the term of this patent is extended or adjusted under 35 U.S.C. 154(b) by 0 days.

(21) Appl. No.: 16/768,038

(22) PCT Filed: Nov. 27, 2018

(86) PCT No.: PCT/US2018/062656
§ 371 (c)(1),
(2) Date: May 28, 2020

(87) PCT Pub. No.: WO2019/108553
PCT Pub. Date: Jun. 6, 2019

(65) Prior Publication Data

US 2020/0365076 A1 Nov. 19, 2020

Related U.S. Application Data

(60) Provisional application No. 62/592,375, filed on Nov. 29, 2017.

(51) Int. Cl.
*G09G 3/20* (2006.01)
*G09G 3/32* (2016.01)
(Continued)

(52) U.S. Cl.
CPC ....... *G09G 3/32* (2013.01); *G09G 2310/0267* (2013.01); *G09G 2320/04* (2013.01)

(58) Field of Classification Search
CPC ............ G09G 3/32; G09G 2310/0267; H05B 45/10–37
See application file for complete search history.

(56) References Cited

U.S. PATENT DOCUMENTS

| | | | |
|---|---|---|---|
| 8,721,129 | B2 | 5/2014 | Tseng |
| 2011/0058050 | A1 | 3/2011 | Lasang et al. |

(Continued)

FOREIGN PATENT DOCUMENTS

| | | | | | |
|---|---|---|---|---|---|
| CN | 106710518 A | * | 5/2017 | ............... | G09G 3/32 |
| CN | 106952610 A | * | 7/2017 | ............... | G09G 3/32 |

(Continued)

OTHER PUBLICATIONS

International Search Report and Written Opinion for International Application No. PCT/US2018/062656, dated Feb. 11, 2019, 6 pages.

*Primary Examiner* — Lin Li
(74) *Attorney, Agent, or Firm* — Stoel Rives LLP

(57) ABSTRACT

Active discharge circuitry for fast discharging of charge on an LED display matrix includes a mechanism to effectuate circuit path switching so as to electrically connect a charged node to a discharge circuit for controlled discharging of unwanted charge until it reaches a desired (e.g., programmable) value. The active discharge circuitry includes a control circuit generating appropriate timing and digital control signals for starting and stopping (e.g., actuating a switch) the discharge activities. The disclosed techniques accommodate variations in channel-to-channel start times for mitigating ghosting effects that would otherwise be presented from the LED display matrix due to residual (i.e., unwanted) charges remaining electrically loaded on display elements via, for example, charged parasitic capacitance or other such transients, after a current driver of a specific channel has stopped driving.

16 Claims, 4 Drawing Sheets

(51) Int. Cl.

| | |
|---|---|
| ***H03K 7/08*** | (2006.01) |
| ***H05B 45/46*** | (2020.01) |
| ***G09G 3/36*** | (2006.01) |

(56) References Cited

U.S. PATENT DOCUMENTS

| | | | | |
|---|---|---|---|---|
| 2012/0176062 | A1 | 7/2012 | Sato et al. | |
| 2012/0206430 | A1 | 8/2012 | Li et al. | |
| 2013/0147697 | A1* | 6/2013 | Sung | G02F 1/136204 345/87 |
| 2014/0139139 | A1* | 5/2014 | Li | H05B 45/37 315/297 |
| 2015/0181666 | A1* | 6/2015 | Muesch | H05B 45/46 315/185 R |
| 2016/0173078 | A1* | 6/2016 | Shih | H03K 5/12 327/172 |
| 2017/0249882 | A1* | 8/2017 | Lee | G09G 3/3241 |

FOREIGN PATENT DOCUMENTS

| | | | | |
|---|---|---|---|---|
| CN | WO 2018171160 | A1 * | 9/2018 | G09G 3/20 |
| KR | WO 2015/137710 | A1 * | 9/2015 | G09G 3/3677 |

* cited by examiner

ACTIVE DISCHARGE CIRCUITRY FOR DISPLAY MATRIX

RELATED APPLICATIONS

This application is a National Stage of International Application No. PCT/US2018/062656, filed Nov. 27, 2018, which claims priority benefit of U.S. Provisional Patent Application No. 62/592,375, filed Nov. 29, 2017, which are hereby incorporated by reference in their entireties.

TECHNICAL FIELD

This disclosure generally relates to light-emitting diode (LED) drivers and, more particularly, to ghost image prevention for an LED-matrix driver.

BACKGROUND INFORMATION

An LED display panel generally refers to a device which comprises an array of LEDs that are arranged in one or more rows and columns. An LED display panel may include a plurality of sub-modules, each sub-module having one or more such LED arrays. LED display panels may employ arrays of LEDs of a single color or different colors. When LEDs of the same color are used in certain display applications, each LED normally corresponds to a display unit or pixel. When LED panels employ LEDs of different colors for a full-color display, a display unit or pixel normally includes a cluster of three LEDs: typically a red LED, a green LED, and a blue LED. Such a cluster of three LEDs may be referred to as an RGB unit.

An LED driver circuit delivers power to the array of LEDs and controls the current delivered to the array of LEDs. The LED driver circuit may be a single channel driver or a multi-channel driver. Each channel of the driver circuit may deliver power to a plurality of LEDs and control the current delivered to the LEDs. Multiple channels electrically coupled together, e.g., on a node of a so-called common cathode configuration, are often referred to as a scan line, which is described in Patent Application Publication No. US 2015/0123555 A1 of Li et al., published May 7, 2015.

LED driver circuits control the brightness of the LEDs by varying the current delivered to and flowed through the LEDs. In response to the delivered current, the LED emits light at an intensity in accordance with the characteristic specifications of the LED. More current delivered to the LED usually produces more brightness of light emitted by the LED. To effectively control the delivery of current, LED driver circuits may employ a constant current source in combination with the modulation (i.e., turning ON and OFF) of the constant current source, using, for example, pulse width modulation (PWM) to achieve a desired average (mean) current over each scan cycle.

LEDs are often used in visual display applications that employ time-multiplexing of numerous LEDs in the display. A time-multiplexing LED matrix display may include one or more arrays of LEDs. Time-multiplexing is a scheme that involves connecting cathodes of multiple LEDs to each output pin of an LED driver. A time-multiplexed circuit is advantageous because it uses fewer LED drivers for a given amount of LEDs, which results in lower cost and smaller size. One drawback of time-multiplexing display systems is a side-effect called ghosting, spike noise, or phantom noise, which are typically perceived as unwanted lighting emission.

SUMMARY OF THE DISCLOSURE

Active discharge circuitry for rapid discharging of charge on an LED display matrix includes a mechanism to effectuate electrically connecting a charged node to a discharge circuit for controlled discharge of any unwanted charge. In some embodiments, a discharge path is provided for discharging the node until it reaches a desired (e.g., programmable) value. The active discharge circuitry includes a control circuit generating appropriate timing and digital control signals for starting and stopping (i.e., actuating) a switch facilitating the discharge activities. The disclosed techniques accommodate variations in channel-to-channel start times for mitigating ghosting effects that would otherwise be presented by the LED display matrix due to residual (i.e., unwanted) charges remaining electrically loaded on display elements (LEDs) via, for example, charged parasitic capacitance or other such transients, after a current driver of a specific channel has stopped driving the display elements.

According to one embodiment, ghosting effects are reduced by discharging a charge stored by parasitic capacitance coupled to a channel of an LED display. Specifically, circuity receives a timing signal indicating that the charge is available to be discharged for at least a portion of a time following a PWM cycle and preceding a new scan cycle. In response to the timing signal, the circuity compares a reference voltage signal with a discharge voltage signal attributable to the charge. The circuitry applies to a switch device an actuation signal that, based on the comparing, actuates the switch device and thereby couples the channel to a discharge path.

In another embodiment, active discharge circuitry reduces ghosting effects by controlling discharge of a charge stored by parasitic capacitance coupled to a channel of a light-emitting diode (LED) display. The active discharge circuitry includes a comparator having first and second comparator inputs to which are applied, respectively, a discharge voltage signal attributable to the charge and a reference voltage signal, the comparator having a comparator output; a node on which the discharge voltage signal is provided; a first switch device having first, second, and third terminals coupled to, respectively, the node, the comparator output, and a discharge path; and a second switch device that, in response to application of an active discharge control signal, is actuated to cause the comparator to compare the discharge voltage signal applied to the first comparator input and the reference voltage signal applied to the second comparator input so as to generate at the comparator output a comparison signal applied to the second terminal of the first switch device that, based on the comparison signal, controllably couples the channel to the discharge path.

Additional aspects and advantages will be apparent from the following detailed description of embodiments, which proceeds with reference to the accompanying drawings.

DETAILED DESCRIPTION OF EMBODIMENTS

The present inventor has recognized that ghosting effects are caused by so-called anode gate float. Specifically, an LED has a PN junction that applies relatively high levels of parasitic capacitance to electrical traces carrying current from a current driver to the PN junction so as to cause it to emit light. An accumulation of stray capacitance on the traces of a printed circuit board (PCB), for example, results in residual charge that maintains a forward bias across the PN junctions such that the LEDs emit light even after they are signaled to shut off. In other words, the unwanted charge provides undesired forward electron flow through the PN junction, which is visually perceived as a ghost image (or simply, ghosting) phenomenon. This phenomenon may also be caused by, among other things, other stray PCB capacitances causing unwanted charges on anodes, or any other unwanted forward bias of the PN junctions that force time-multiplexed LEDs to flash when they should remain off.

Figure 1:
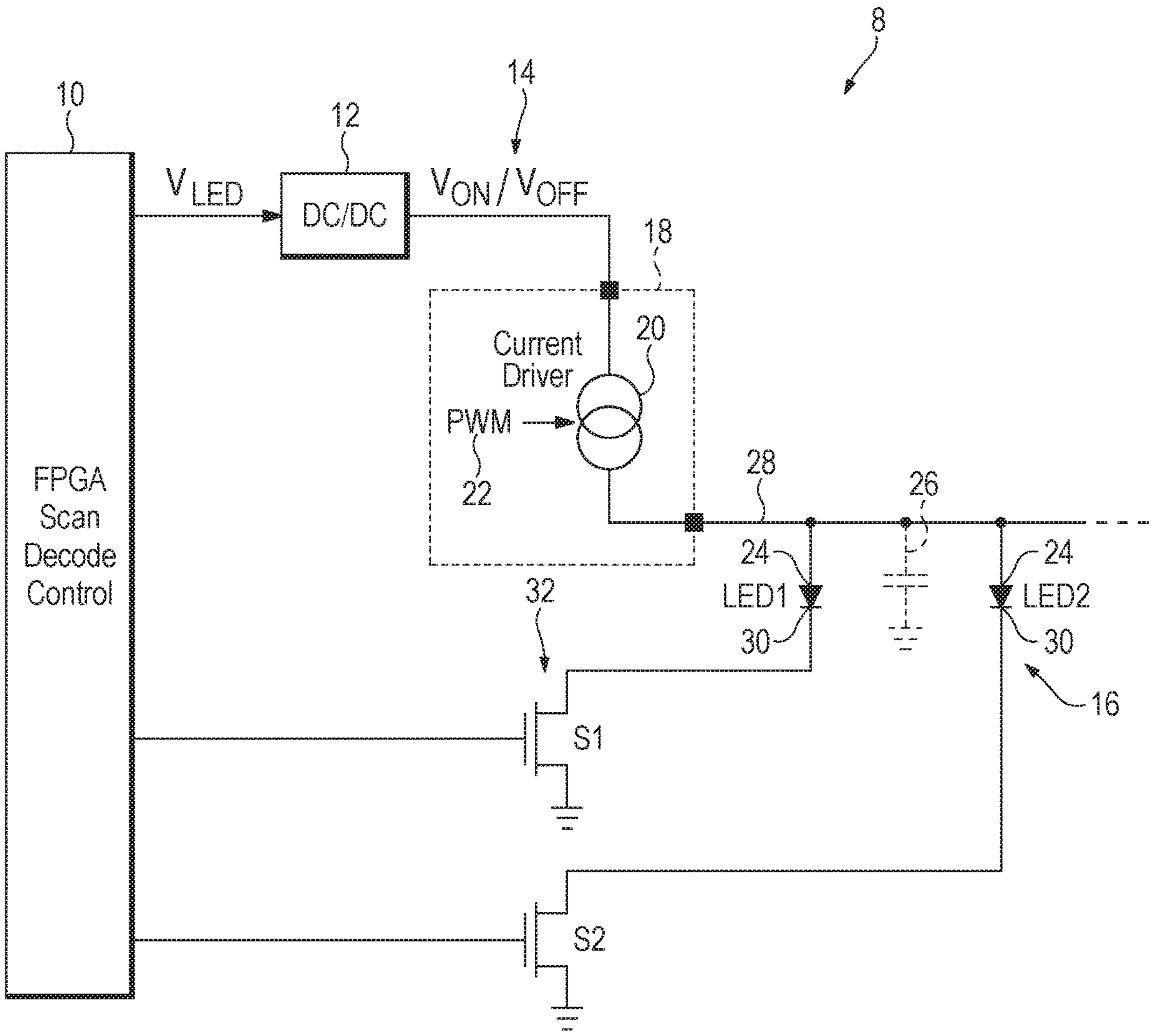
FIG. 1 is an electrical schematic and block diagram showing a model of unwanted charge in a circuit of an LED display matrix.

For example, FIG. 1 shows a portion of LED display panel circuitry 8 including a controller 10 (e.g., an FPGA) responsible for controlling an optional DC/DC converter 12 so as to produce an input voltage 14 having an optional $V_{ON}$ voltage level optimized to reduce power consumption of system LEDs 16. The voltage level of $V_{ON}$ is typically less than that of a more standard system voltage source, $V_{LED}$, which has of level of about 2.8 volts (V) for red LEDs and 3.8 V for blue and green LEDs, but either $V_{ON}$ or $V_{LED}$ may serve as input voltage 14 applied to LED current driver circuitry 18.

LED current driver circuitry 18 includes a current driver 20 that is actuated in response to a PWM signal 22. Undesirable charge electrically coupled to anodes 24 of multiple LEDs 16 is represented by a parasitic capacitor 26 (also referred to simply as parasitic capacitance 26). Parasitic capacitor 26 and anodes 24 are connected by a trace 28 (also referred to as channel 28). At cathodes 30 of multiple LEDs 16, corresponding scan switches 32 may be implemented internally to or externally from controller 10.

A rudimentary technique for reducing ghosting entails changing the bias level of input voltage 14 and waiting for accumulated charge to passively dissipate. This so-called passive (i.e., non-active) approach, however, requires a mechanism to rapidly switch back and forth between $V_{ON}$ and $V_{OFF}$. But controlling external DC/DC converter 12 adds cost and complexity to LED display panel circuitry 8. Such external control (e.g., via controller 10) also imposes substantial time gaps between consecutive cycles of scanning through an LED matrix. This is so because input voltage 14 (e.g., $V_{ON}$) is applied to all channels that are electrically coupled to LED current driver circuitry 18 so any transition from $V_{ON}$ to $V_{OFF}$ for passive ghost elimination simultaneously affects all channels. Additionally, control over DC/DC converter 12 is managed by controller 10 and therefore entails serial commands communicated to among the circuitry components. Such serial commands are subject to propagation delays and, perforce, timing errors.

Figure 2:
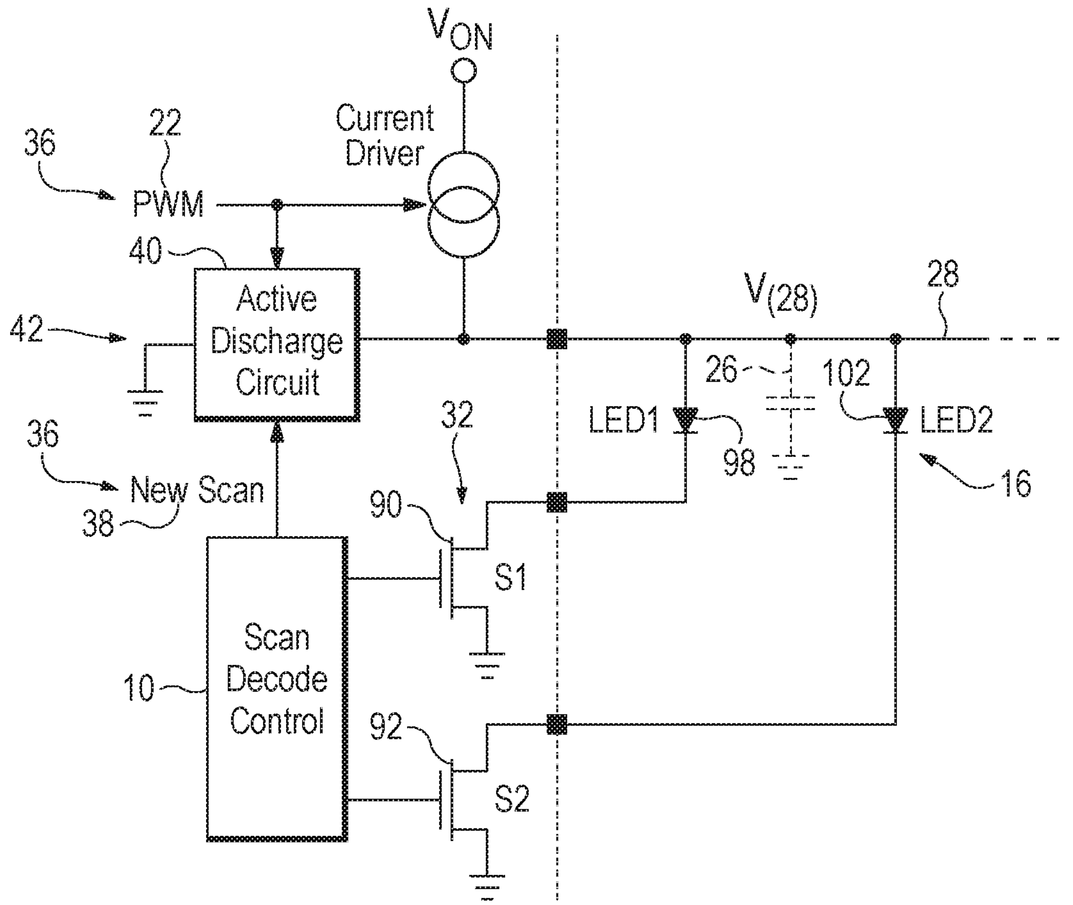
FIG. 2 is an electrical schematic and block diagram including a high-level block representing active discharge circuitry.

FIG. 2 shows active discharge circuitry 40 to actively mitigate ghosting by providing a controllable discharge path 42 for discharging parasitic capacitance 26 during a configurable time in which active discharge occurs. Note that the right-hand side of FIG. 2 includes reference numbers identical to those appearing in FIG. 1 because both figures show similar LED array components (e.g., LEDs 16) and associated capacitances external to an LED driver integrated circuit (IC). Some other components that are also common to multiple figures—including components internal to an LED driver IC, as shown on the left-hand side of FIG. 2—also share identical reference numbers throughout this disclosure.

A timing signal 36 indicates that unwanted charge is available to be discharged for at least a portion of a time following a cycle of PWM signal 22 and preceding a cycle of new scan signal 38. Skilled persons will appreciate that the term "cycle" generically refers to a repeatable timing event such as when PWM pulses are applied (or halted) during refresh periods of a segment or when a scan line is actuated, though the exact duration and timing for such events may vary (e.g., one cycle may be longer than the next and a cycle may even be skipped such as when an LED is not illuminated).

Figure 4:
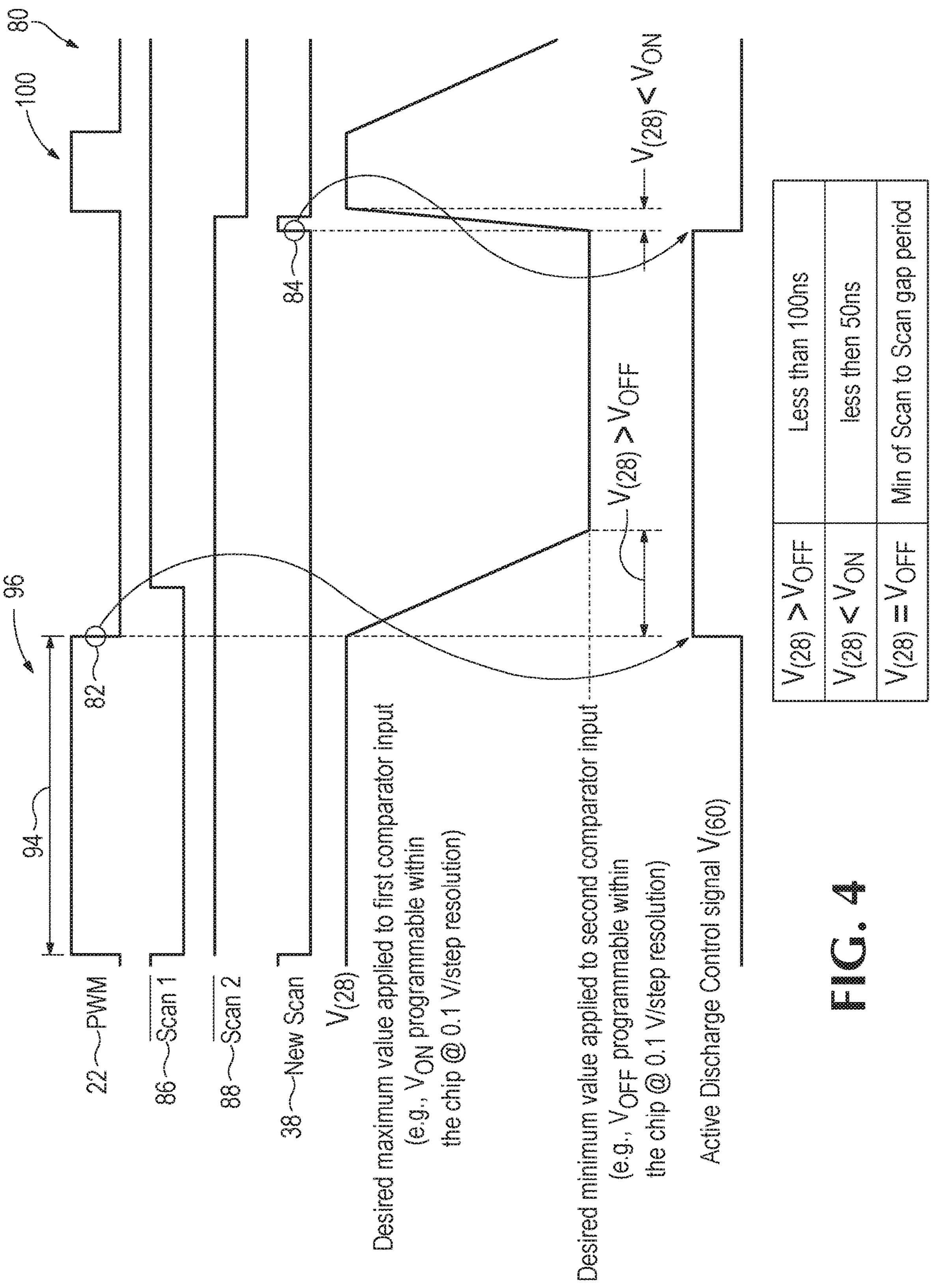
FIGS. 4 and 5 are, respectively, first and second timing diagrams showing two different embodiments of control signals and node voltage levels for controlling the active discharge circuitry of FIGS. 2 and 3.

Timing signal 36 controls active discharge circuitry 40 such that discharge path 42 is connected while an unwanted charge on trace 28 is being removed (see, e.g., falling sloped lines of a discharge voltage signal $V_{(28)}$ in FIG. 4). Thus, according to the embodiment of FIG. 2, reference voltage $V_{ON}$ for LEDs 16 need not be adjusted dynamically or rapidly. In some embodiments, $V_{ON}$ may be a fixed value. In other embodiments, it could be adjusted or tuned for power optimization but even in that case the adjustments need not occur dynamically (as in passive ghost elimination) and instead may be performed at an initial (calibration) stage of operation.

Figure 3:
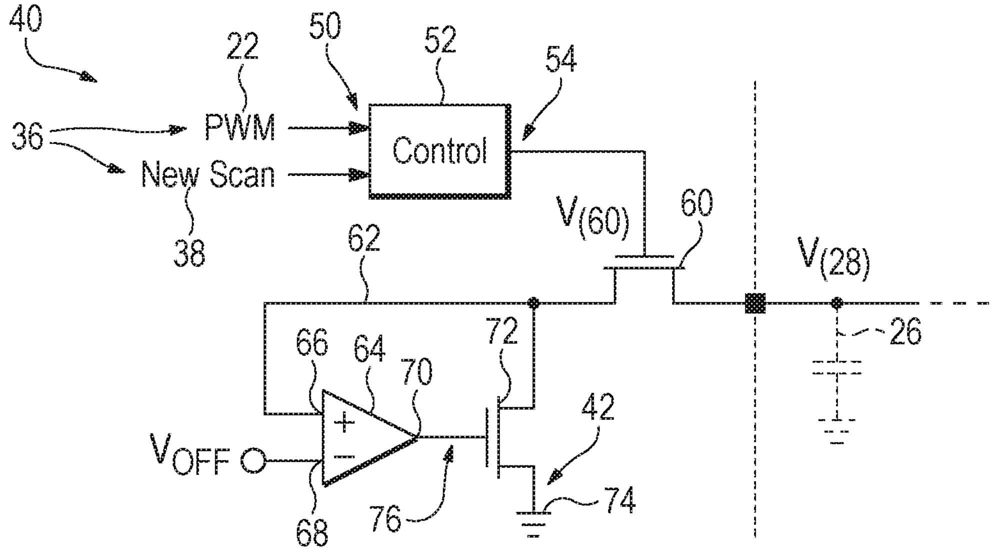
FIG. 3 is an electrical schematic and block diagram showing the active discharge circuitry of FIG. 2.

FIG. 3 shows in greater detail an embodiment of discharge circuitry 40 providing the active discharge path 42. Timing signal 36 (i.e., PWM signal 22 or new scan signal 38) is applied to a controller input 50 (two are shown in FIG. 3) of active discharge control logic 52 (which could be included with or realized in controller 10, FIG. 2). For example, controller input 50 is coupled to receive PWM signal 22 (having a trailing edge described later in FIG. 4) such control logic 52 configures its output 54 to change a state of an active discharge control (voltage) signal $V_{(60)}$ (see, e.g., FIG. 4) in response to the trailing edge of PWM signal 22, e.g., between PWM cycles. Skilled persons will appreciate that a change in state includes a change in logic level or, more specifically, a change from indicating an off condition to a state indicating an on condition.

More generally, in response to timing signal 36 indicating that unwanted charge is available to be discharged, active discharge control logic 52 actuates a switch 60 by, e.g., applying active discharge control voltage $V_{(60)}$ to a gate terminal of a MOSFET (or similar actuation node). Accordingly, switch 60 is actuated such that node voltage $V_{(28)}$ is provided to a node 62. In other words, node voltage $V_{(28)}$ is electrically coupled through switch 60 to provide a discharge voltage signal on node 62. Because any drain-source voltage drop is typically negligible in the disclosed discharge application, discharge voltage signal is also shown and referred to as node voltage $V_{(28)}$, which is readily measurable on trace 28. Skilled persons will also appreciate that discharge voltage signal $V_{(28)}$ represents unwanted charge, but it may also indicate whether capacitance is charged as shown in a rising charging cycle of FIG. 4. Thus, the phrase "discharge voltage signal" should not be interpreted to solely mean a falling voltage during a discharge cycle but should instead be understood to encompass, among other things, signals capable of indicating unwanted charge.

A comparator 64 includes an input 66 (e.g., a non-inverting terminal) and an input 68 (e.g., an inverting terminal). The term "terminal" need not be interpreted to mean an externally accessible node on an electrical part because this term also encompasses, e.g., internal transistor nodes that do not necessarily provide a point of connection to external circuits. Comparator 64 receives at inputs 66 discharge voltage signal $V_{(28)}$. Input 68 receives a programmable reference voltage signal $V_{OFF}$ (typically programmed to be about 0.3-0.7 V). Comparator 64 compares these voltages applied to its inputs 66, 68 and, in response, produces at its output 70 a voltage signal actuating a switch 72. When it is conducting, switch 72 electrically couples trace 28 to ground 74 so as to actively discharge unwanted charge until the level of discharge voltage signal $V_{(28)}$ reaches that of $V_{OFF}$, which thereby changes a comparison signal generated by comparator 64 to shut off switch 72. For example, comparison signal 76 acts as an actuation signal to actuate switch 72 in response to the comparing indicating that a level of discharge voltage signal $V_{(28)}$ exceeds that of reference voltage signal, $V_{OFF}$. Thus, comparison signal 76 swings from first to second voltage levels that are different from each other (e.g., a positive gate-actuation voltage and ground potential). The first and second voltage levels thereby indicate a level of discharge voltage signal $V_{(28)}$ is, respectively, greater and less than that of the reference voltage signal, $V_{OFF}$.

In another embodiment, comparator 64 and associated circuitry may be substituted by other components that facilitate a controllable discharge path. For example, instead of discharging to $V_{OFF}$, $V_{(28)}$ can be taken down to zero volts by a single switch to ground. An advantage of discharge circuitry 40, however, is that it is faster to discharge $V_{(28)}$ to a value of $V_{OFF}$ (just past the point at which the LEDs are off) instead of all the way down to zero volts. Skilled persons will appreciate that other circuitry may be used to actively discharge $V_{(28)}$ until it reaches $V_{OFF}$, ground, or other desired voltage level.

FIG. 4 is a timing diagram 80 showing signal timing for performing active ghost elimination according to a first embodiment. For channel 28 shown in FIGS. 2 and 3, as a trailing edge 82 (falling edge) of PWM signal 22 is detected by active discharge control logic 52 (FIG. 3), active discharge control logic 52 changes a state (i.e., from low to high) of active discharge control signal $V_{(60)}$. Active discharge control signal $V_{(60)}$ is then applied by controller output 54 to the gate of switch 60 (FIG. 3), which is thereby actuated to start the active discharge operation described previously. The operation may then end after a specific clock-counting period (or other predetermined discharge time), or it may end at a leading edge 84 of a new scan cycle indicated by new scan signal 38. Skilled persons will appreciate that a similar sequence and circuitry may also be implemented for other channels in a multi-channel system.

For completeness, also shown in FIG. 4 are a first scan signal 86 and a second scan signal 88. These signals optionally employ inverted logic, which may be used for any other signals as well. For example, while first scan signal 86 has a low logic level, a first scan switch 90 (FIG. 2) is actuated, and while second scan signal 88 has a low logic level, a second scan switch 92 (FIG. 2) is actuated. Thus, when first scan switch 90 (FIG. 2) is actuated, a duration 94 of a first cycle 96 of PWM signal 22 controls how long current is applied to an LED 98 (FIG. 2). Immediately when first cycle 96 is completed, i.e., trailing edge 82 indicating a conclusion of first cycle 96, and before a start of a next cycle 100 for an LED 102 (FIG. 2), active discharge is initiated.

Figure 5:
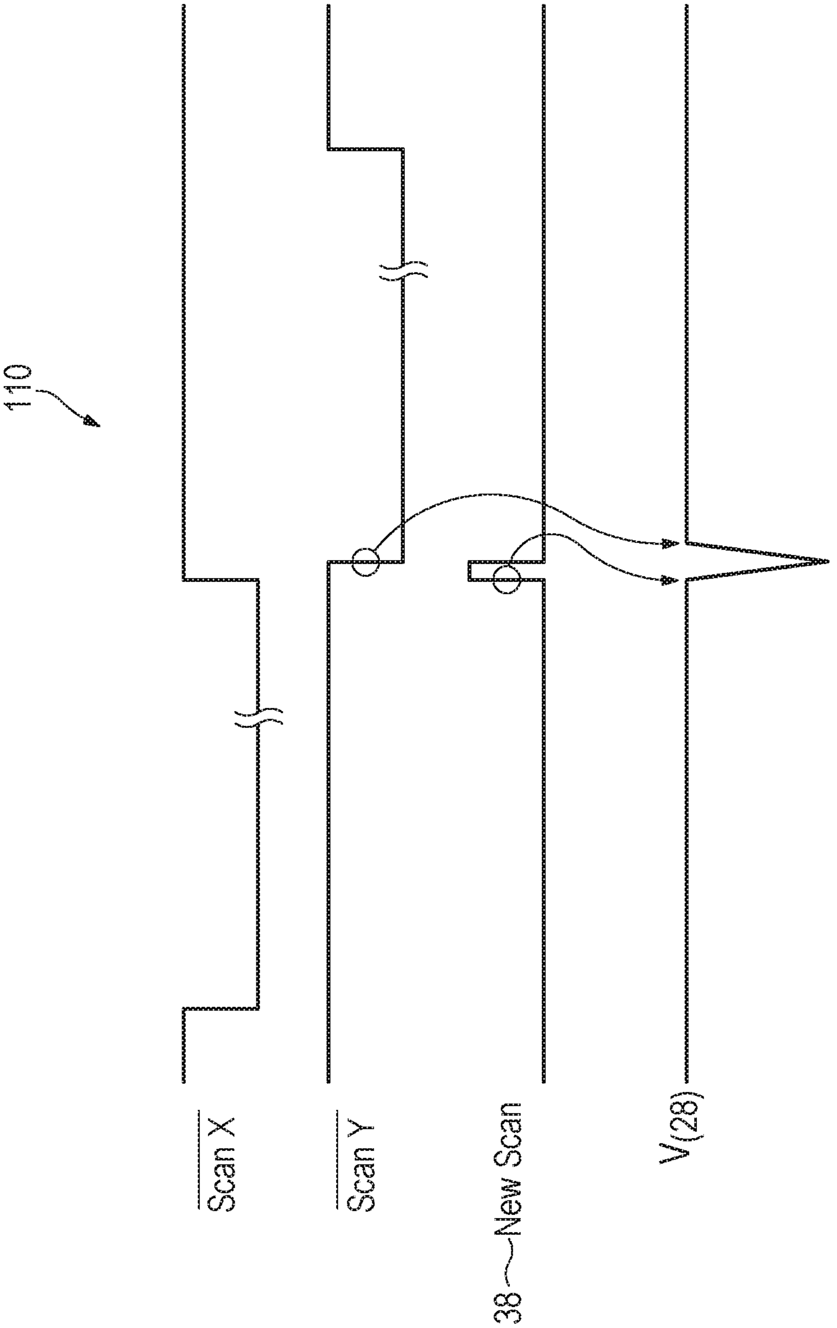

FIG. 5 is a timing diagram 110 showing signal timing for performing active ghost elimination according to a second embodiment. In this embodiment, new scan signal 38 initiates and stops the active discharge operation. A new scan signal is typically generated as a single grayscale clock (GCLK) pulse wherein the leading edge occurs one clock pulse width before the completion of the current scan and the trailing edge is synchronized with the completion of the current scan. Additional description of an example of a GCLK and its relationship with PWM and scan timing is available in International Application Publication No. WO 2018/098036 titled "Intensity Scaled Dithering Pulse Width Modulation," of Nadershahi.

The described features, operations, or characteristics may be arranged and designed in a wide variety of different configurations or combined in any suitable manner in one or more embodiments. Thus, the detailed description of the embodiments of the systems and methods is not intended to limit the scope of the disclosure, as claimed, but is merely representative of possible embodiments of the disclosure. In addition, it will also be readily understood that the order of steps or actions of methods described in connection with the embodiments disclosed may be changed, as would be appreciated by skilled persons. Thus, any order in the drawings or detailed description is for illustrative purposes only and is not meant to imply a required order, unless specified to require an order.

Embodiments may include various operations, blocks, and circuitry, which may be embodied in machine-executable instructions to be executed by a general-purpose or special-purpose computer (or other electronic device). Alternatively, the operations, blocks, and circuitry may be performed by hardware components that include specific logic for performing the steps, or by a combination of hardware, software, or firmware.

The hardware may comprise devices such as comparators, amplifiers, oscillators, counters, frequency generators, ramp circuits and generators, digital logic, analog circuits, application specific integrated circuits (ASIC), microprocessors, microcontrollers, digital signal processors (DSPs), state machines, digital logic, field programmable gate arrays (FPGAs), complex logic devices (CLDs), timer integrated circuits, digital to analog converters (DACs), analog to digital converters (ADCs), etc. For example, control logic 52 may include flip-flops and other logic components that carry out logic operations, based on PWM or new scan timing signals, for producing gate-drive actuation signals initiating and concluding the active discharge operation.

Embodiments including various operations, blocks, and circuitry may also be provided as a computer program product including a computer-readable storage medium having stored instructions thereon that may be used to program a computer (or other electronic device) to perform processes described herein. The computer-readable storage medium may include, but is not limited to: hard drives, floppy diskettes, optical disks, CD-ROMs, DVD-ROMs, ROMs, RAMs, EPROMs, EEPROMs, magnetic or optical cards, solid-state memory devices, or other types of medium/machine-readable medium suitable for storing electronic instructions.

In certain embodiments, a particular software module may comprise disparate instructions stored in different locations of a memory device, which together implement the described functionality of the module. Indeed, a module may comprise a single instruction or many instructions, and may be distributed over several different code segments, among different programs, and across several memory devices.

Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device, or across several memory devices, and may be linked together in fields of a record in a database across a network.

Skilled persons will appreciate that many changes may be made to the details of the above-described embodiments without departing from the underlying principles of the disclosure. The scope of the present invention should, therefore, be determined only by the following claims.

The invention claimed is:

1. Active discharge circuitry to reduce ghosting effects by controlling discharge of a charge stored by parasitic capacitance coupled to a channel of a light-emitting diode (LED) display, the active discharge circuitry comprising:

- a comparator having first and second comparator inputs to which are applied, respectively, a discharge voltage signal attributable to the charge and a reference voltage signal, the comparator having a comparator output;
- a node on which the discharge voltage signal is provided;
- a first switch device having first, second, and third terminals coupled to, respectively, the node, the comparator output, and a discharge path; and
- a second switch device that, in response to application of an active discharge control signal, is actuated to cause the comparator to compare the discharge voltage signal applied to the first comparator input and the reference voltage signal applied to the second comparator input so as to generate at the comparator output a comparison signal applied to the second terminal of the first switch device that, based on the comparison signal, controllably couples the channel to the discharge path.

2. The active discharge circuitry of claim 1, in which the second switch device includes fourth, fifth, and sixth terminals coupled to, respectively, the channel, the node, and an actuation node on which the active discharge control signal is provided.

3. The active discharge circuitry of claim 1, in which the first comparator input is an inverting input and the second comparator input is a non-inverting input.

4. The active discharge circuitry of claim 1, in which the comparison signal includes first and second voltage levels that are different from each other, the first and second voltage levels indicating a level of the discharge voltage signal is, respectively, greater and less than that of the reference voltage signal.

5. The active discharge circuitry of claim 1, further comprising a controller input and a controller output, the controller input coupled to receive a pulse width modulation (PWM) signal having a trailing edge, and the controller output configured to change a state of the active discharge control signal in response to the trailing edge of the PWM signal.

6. The active discharge circuitry of claim 5, in which the controller input comprises a first controller input, the state of the active discharge control signal comprises a first state, and further comprising a second controller input, different from the first controller input, coupled to receive a new scan signal, the controller output, in response to the new scan signal, is configured to change from the first state to a second state of the active discharge control signal that is different from the first state.

7. The active discharge circuitry of claim 5, in which the state comprises a first state, and the controller output is configured to change, after a predetermined discharge time, from the first state to a second state of the active discharge control signal that is different from the first state.

8. The active discharge circuitry of claim 1, in which the reference voltage signal is programmable.

9. The active discharge circuitry of claim 1, in which the node, in response to actuation of the second switch device, is coupled to one or more anodes of LEDs defining the channel of the LED display.

10. A method for reducing ghosting effects by discharging a charge stored by parasitic capacitance coupled to a channel of a light-emitting diode (LED) display, the method comprising:

- receiving a timing signal indicating that the charge is available to be discharged for at least a portion of a time following a pulse width modulation (PWM) cycle and preceding a new scan cycle;
- in response to the timing signal, comparing a reference voltage signal with a discharge voltage signal attributable to the charge; and
- applying to a switch device an actuation signal that, based on the comparing, actuates the switch device and thereby couples the channel to a discharge path.

11. The method of claim 10, in which the timing signal is a trailing edge of a PWM signal indicating a conclusion of the PWM cycle.

12. The method of claim 11, in which the actuation signal actuates the switch device in response to the comparing indicating that a level of the discharge voltage signal exceeds that of the reference voltage signal.

13. The method of claim 11, further comprising:

- actuating the switch device during a first state of the actuation signal; and
- in response to a new scan signal, changing from the first state to a second state to stop actuating the switch device for a new cycle of the PWM cycle.

14. The method of claim 10, in which the timing signal is a leading edge of a new scan signal indicating a start of the new scan cycle.

15. The method of claim 10, in which the switch device is a first switch device, the method further comprising, in response to the timing signal, applying to a second switch device an active discharge control signal that actuates the second switch device to apply the discharge voltage signal to one of first and second inputs of a comparator for the comparing it with the reference voltage signal applied to the other one of the first and second inputs.

16. The method of claim 15, further comprising generating the actuation signal at a comparator output of the comparator.

* * * * *